United States Patent
Syouda

(10) Patent No.: US 10,637,267 B2
(45) Date of Patent: Apr. 28, 2020

(54) BATTERY STATE DETECTION DEVICE

(71) Applicant: YAZAKI CORPORATION, Tokyo (JP)

(72) Inventor: Takahiro Syouda, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 242 days.

(21) Appl. No.: 14/933,198

(22) Filed: Nov. 5, 2015

(65) Prior Publication Data

US 2016/0056643 A1 Feb. 25, 2016

Related U.S. Application Data

(63) Continuation of application No. PCT/JP2014/062300, filed on May 8, 2014.

(30) Foreign Application Priority Data

May 9, 2013 (JP) .................................. 2013-099257

(51) Int. Cl.
  *H02J 7/00* (2006.01)
  *G01R 31/364* (2019.01)
  *G01R 31/392* (2019.01)

(52) U.S. Cl.
  CPC ............ *H02J 7/007* (2013.01); *G01R 31/364* (2019.01); *G01R 31/392* (2019.01);
  (Continued)

(58) Field of Classification Search
  CPC .. H02J 7/007; G01R 31/3679; G01R 31/3696
  (Continued)

(56) References Cited

U.S. PATENT DOCUMENTS

2002/0171400 A1* 11/2002 Koyama ................ G04G 19/08
  320/135
2008/0224709 A1* 9/2008 Tae ..................... G01R 31/3662
  324/430

(Continued)

FOREIGN PATENT DOCUMENTS

JP 9-54147 A 2/1997
JP 2009-53012 A 3/2009

(Continued)

OTHER PUBLICATIONS

English translation of JP2009-053012.*
(Continued)

*Primary Examiner* — Richard Isla
*Assistant Examiner* — Johalia A Torres Ruiz
(74) *Attorney, Agent, or Firm* — Kenealy Vaidya LLP

(57) ABSTRACT

A battery state detection device capable of suppressing falling in detection precision of a battery state is provided. A battery state detection device retains a voltage between electrodes of a secondary battery in a first capacitor under charging conducted by a charging unit. When the voltage between the electrodes of the secondary battery has become a predetermined state detection voltage, the battery state detection device stops charging of the secondary battery, and connects a second capacitor between the electrodes of the secondary electrode. When a charge flows into the second capacitor and the voltage of the second capacitor has become stable, the battery state detection device detects internal resistance of the secondary battery based on a charging current and an amplified voltage output from an amplifier configured to amplify a difference value between the voltage retained in the first capacitor and the voltage retained in the second capacitor.

2 Claims, 5 Drawing Sheets

(52) U.S. Cl.
CPC .......... *H02J 7/0047* (2013.01); *H02J 7/0063* (2013.01); *H02J 7/0048* (2020.01); *H02J 2007/0067* (2013.01)

(58) Field of Classification Search
USPC ........................................................ 320/134
See application file for complete search history.

(56) References Cited

U.S. PATENT DOCUMENTS

| | | | | |
|---|---|---|---|---|
| 2010/0327958 | A1* | 12/2010 | Guo ................... | H03K 17/0822 327/534 |
| 2012/0121952 | A1* | 5/2012 | Majima ................ | G01R 31/392 429/90 |
| 2015/0188329 | A1* | 7/2015 | Bradley ............... | G01R 31/389 320/107 |

FOREIGN PATENT DOCUMENTS

| JP | 2009053012 A | * | 3/2009 |
|---|---|---|---|
| JP | 2009053012 A | * | 3/2009 |

OTHER PUBLICATIONS

International Search Report and Written Opinion for PCT Patent App. No. PCT/JP2014/062300 (dated Aug. 5, 2014) with English translation of the Search Report.

* cited by examiner

BATTERY STATE DETECTION DEVICE

TECHNICAL FIELD

The present invention relates to a battery state detection device which detects the state of a battery such as a degree of degradation and internal resistance of the battery.

BACKGROUND ART

For example, on various vehicles such as an electric vehicle (EV) which travels using an electric motor and a hybrid electric vehicle (HEV) which travels using an engine and an electric motor, a secondary battery such as a lithium ion charging battery or a nickel hydrogen charging battery is mounted as a source of power for the electric motor.

It is known that such a secondary battery is degraded gradually by repetition of charging and discharging and a storable capacity (such as a current capacity and a power capacity) decreases gradually. In an electric vehicle or the like using a secondary battery, a storable capacity is found by detecting the degree of degradation of the secondary battery and a distance over which the vehicle can travel using the secondary battery, the life of the secondary battery, or the like is calculated.

As one of indexes indicating the degree of degradation of the secondary battery, there is SOH (State of Health), which is a ratio of a current storable capacity to an initial storable capacity. It is known that the SOH has correlation to internal resistance of the secondary battery. If the internal resistance of the secondary battery is found, the SOH can be detected based on the internal resistance.

For example, a direct current signal that becomes constant in voltage and current, or an alternating current signal that becomes constant in voltage and current waveforms is applied to the secondary battery. The internal resistance of the secondary battery can be found based on a response thereof. An example of technique of measuring such internal resistance of the secondary battery is disclosed in Patent Literature 1 and so on.

In an assembled battery formed by combining a plurality of single cell batteries, a single cell battery that becomes a measured object (hereafter referred to simply as "measured battery") is energized from the external. At this time, according to a method disclosed in Patent Literature 1, a choke coil is provided between the measured battery and other single cell batteries connected adjacent to the measured battery to suppress divided currents that flow through single cell batteries other than the measured battery. As a result, influence of other single cell batteries connected to the measured battery is excluded. A voltage of the measured battery before energization and a voltage of the measured battery at the time when a predetermined time has elapsed since the energization are measured. Internal resistance is calculated from a difference voltage between these voltages and the energization current from the external.

CITATION LIST

Patent Literature

Patent Literature 1: JP H9-54147 A

SUMMARY OF INVENTION

Technical Problem

According to the method disclosed in Patent Literature 1, however, a voltage V between electrodes of the measured battery by using a voltmeter with a terminal (for example, a negative electrode side) of the measured battery taken as reference is measured. Internal resistance of such measured battery is very small. As illustrated schematically in FIG. 5, therefore, a voltage Vr generated by the internal resistance r is very small as compared with a voltage Ve generated by electromotive force of an electromotive force portion e of the measured battery. Accordingly, the ratio of the voltage Vr generated by the internal resistance included in a voltage V (V=Ve+Vr) measured by using the voltmeter becomes very small. Under influence of a measurement error and the like, therefore, it is difficult to detect the voltage Vr generated by the internal resistance of the measured battery with a sufficient precision from the voltage V measured by using the voltmeter. As a result, there is a problem that detection precision of the internal resistance of the measured battery and a battery state such as the SOH having correlation to the internal resistance becomes low.

The present invention aims at solving such a problem. In other words, an object of the present invention is to provide a battery state detection device capable of suppressing lowering of the detection precision of the battery state.

Solution to Problem

To achieve the object, the invention according to a first aspect is a battery state detection device that detects a state of a secondary battery, including: a difference voltage output unit having a first input terminal and a second input terminal, the difference voltage output unit being configured to output a difference voltage depending upon a difference value between voltages respectively input to the first input terminal and the second input terminal; a changeover switch configured to connect a first electrode of the secondary battery to the first input terminal or the second input terminal; a first capacitor provided between the first input terminal and a second electrode of the secondary battery; a second capacitor provided between the second input terminal and the second electrode of the secondary battery; a charging unit configured to let a predetermined charging current flow through the secondary battery to charge the secondary battery; a charging control unit configured to control the charging unit to stop charging of the secondary battery when a voltage between the first electrode and the second electrode of the secondary battery has become a predetermined state detection voltage during charging of the secondary battery conducted by the charging unit; a connection changeover control unit configured to control the changeover switch to connect the first electrode of the secondary battery to the first input terminal under charging of the secondary battery and connect the first electrode of the secondary battery to the second input terminal under suspension of charging of the secondary battery; and a battery state detection unit configured to detect a state of the secondary battery based on the difference voltage output from the difference voltage output unit and the charging current, when a voltage retained by the second capacitor has become stable after the changeover switch is controlled by the connection changeover control unit to change over connection of the first electrode of the secondary battery from the first input terminal to the second input terminal.

In the invention according to the first aspect, the invention according to a second aspect is the battery state detection device further including: a discharging unit configured to let flow a discharging current from the secondary battery to discharge the secondary battery; and a discharging control unit configured to control the discharging unit to discharge the secondary battery when the charging of the secondary battery conducted by the charging unit is stopped by the charging control unit.

In the invention according to the first or second aspect, the invention according to a third aspect is the battery state detection device, wherein the difference voltage output unit is configured to output a voltage obtained by amplifying the difference value with a predetermined amplification factor, as the difference voltage.

Advantageous Effects of Invention

According to the invention stated in the first aspect, the difference voltage output unit has the first input terminal and the second input terminal, and outputs the difference voltage depending upon a difference value between voltages input to the first input terminal and the second input terminal respectively. The changeover switch connects the first electrode of the secondary battery to the first input terminal or the second input terminal. The first capacitor is provided between the first input terminal and the second electrode of the secondary battery to retain the voltage between the first input terminal and the second electrode of the secondary battery. The second capacitor is provided between the second input terminal and the second electrode of the secondary battery to retain the voltage between the second input terminal and the second electrode of the secondary battery. The charging unit lets the predetermined charging current flow through the secondary battery and charges the secondary battery. The charging control unit controls the charging unit to stop charging of the secondary battery when the voltage between the electrodes of the secondary battery has become the predetermined state detection voltage under charging of the secondary battery conducted by the charging unit. The connection changeover control unit controls the changeover switch to connect the first electrode of the secondary battery to the first input terminal under charging of the secondary battery and connect the first electrode of the secondary battery to the second input terminal under suspension of charging of the secondary battery. When the voltage retained by the second capacitor has become stable after the changeover switch is controlled by the connection changeover control unit to change over connection of the first electrode of the secondary from the first input terminal to the second input terminal, the battery state detection unit detects the state of the secondary battery based on the difference voltage output from the difference voltage output unit and the charging current.

Under charging, therefore, the first electrode of the secondary battery is connected to the first input terminal of the difference voltage output unit by the changeover switch. As a result, charge flows into the first capacitor from the secondary battery and the charging unit. Since charging of the secondary battery is conducted for a comparatively long time, the first capacitor stores charge up to the upper limit of the capacity thereof. The same voltage as the voltage between the electrodes of the secondary battery under charging is retained in the first capacitor. Under suspension of charging, the first electrode of the secondary battery is connected to the second input terminal of the difference voltage output unit by the changeover switch. As a result, charge flows into the second capacitor from the secondary battery. If the second capacitor stores charge up to the upper limit of the capacity thereof, the voltage retained by the second capacitor becomes stable. At this time, the same voltage as the voltage between the electrodes of the secondary battery under suspension of charging is retained in the second capacitor. A voltage $V_c$ between the electrodes of the secondary battery under charging becomes the sum of a voltage $V_{ec}$ generated by electromotive force of the secondary battery and the voltage $V_r$ generated by a flow of the charging current through the internal resistance of the secondary battery ($V_c = V_{ec} + V_r$). A voltage $V_d$ between the electrodes of the secondary battery under suspension of charging becomes the same value as a voltage $V_{ed}$ generated by the electromotive force of the secondary battery ($V_d = V_{ed}$). When the voltage of the second capacitor becomes stable, a portion of charge charged into the secondary battery has flown through the second capacitor. However, a quantity thereof is negligibly small as compared with the capacity of the secondary battery. Therefore, the voltage $V_{ec}$ generated by the electromotive force of the secondary battery contained in the voltage retained by the first capacitor at this time (i.e., the voltage $V_c$ between the electrodes of the secondary battery under charging) and the voltage $V_{ed}$ generated by the electromotive force of the secondary battery contained in the voltage retained by the second capacitor (i.e., the voltage $V_d$ between the electrodes of the secondary battery under suspension of charging) can be regarded as the same value ($V_{ec} = V_{ed}$). Therefore, a difference value $\Delta V$ between the voltage $V_c$ between the electrodes of the secondary battery under charging and the voltage $V_d$ between the electrodes of the secondary battery under suspension of charging becomes the voltage $V_r$ generated by the flow of the charging current through the internal resistance ($\Delta V = V_c - V_d = V_r$). Therefore, a voltage measured by using a voltmeter is not used. The voltage between the electrodes of the secondary battery under charging and the voltage between the electrodes of the secondary battery under suspension of charging are retained respectively. The difference voltage depending upon a difference value between the voltages becomes a value depending upon the internal resistance of the secondary battery. Therefore, it is possible to suppress falling in the detection precision of the state of the secondary battery by detecting the state of the secondary battery by use of the difference voltage.

According to the invention stated in the second aspect, the discharging unit configured to let the discharging current from the secondary battery to conduct discharging and the discharging control unit configured to control the discharging unit to discharge the secondary battery when charging of the secondary battery conducted by the charging unit is stopped by the charging control unit are further included. As a result, the secondary battery is discharged by the discharging unit under suspension of charging. A voltage $V_d$ between the electrodes of the secondary battery at this time becomes a difference between a voltage $V_{ed}$ generated by electromotive force of the secondary battery and a voltage $V_r$ generated by a flow of the discharging current through the internal resistance of the secondary battery ($V_d = V_{ed} - V_r$). For example in the case of the discharging current and the charging current being the same, When the voltage of the second capacitor has become stable, the voltage $V_{ec}$ generated by the electromotive force of the secondary battery contained in the voltage retained by the first capacitor (i.e., the voltage $V_c$ between the electrodes of the secondary battery under charging) and the voltage $V_{ed}$ generated by the electromotive force of the secondary battery contained in the voltage retained by the second capacitor (i.e., the voltage $V_d$ between the electrodes of the secondary battery under suspension of charging) can be regarded as the same value ($V_{ec} = V_{ed}$). Therefore, a difference value $\Delta V$ between the voltage $V_c$ between the electrodes of the secondary battery under charging and the voltage $V_d$ between the electrodes of the secondary battery under discharging becomes a value twice the voltage Vr generated by the flow of the charging current through the internal resistance (ΔV=Vc−Vd=Vr×2). Therefore, a voltage measured by using a voltmeter is not used. The voltage between the electrodes of the secondary battery under charging and the voltage between the electrodes of the secondary battery under suspension of charging are retained respectively. The difference voltage depending upon a difference value between these voltages becomes a value depending upon the internal resistance of the secondary battery. Therefore, it is possible to suppress falling in the detection precision of the state of the secondary battery by detecting the state of the secondary battery by use of the difference voltage. Furthermore, the difference voltage becomes twice in value as compared with the configuration in which discharging is not conducted under suspension of charging. As a result, the falling in the detection precision of the state of the secondary battery can be further suppressed.

According to the invention stated in the third, the difference voltage output unit is configured to output a voltage obtained by amplifying the difference value with a predetermined amplification factor as the difference voltage. As a result, the difference voltage can be obtained as a larger value, and falling in the detection precision of the state of the secondary battery can be further suppressed.

DESCRIPTION OF EMBODIMENTS

First Embodiment

Hereafter, a battery state detection device according to a first embodiment of the present invention will be described with reference to FIG. 1 and FIG. 2.

Figure 1:
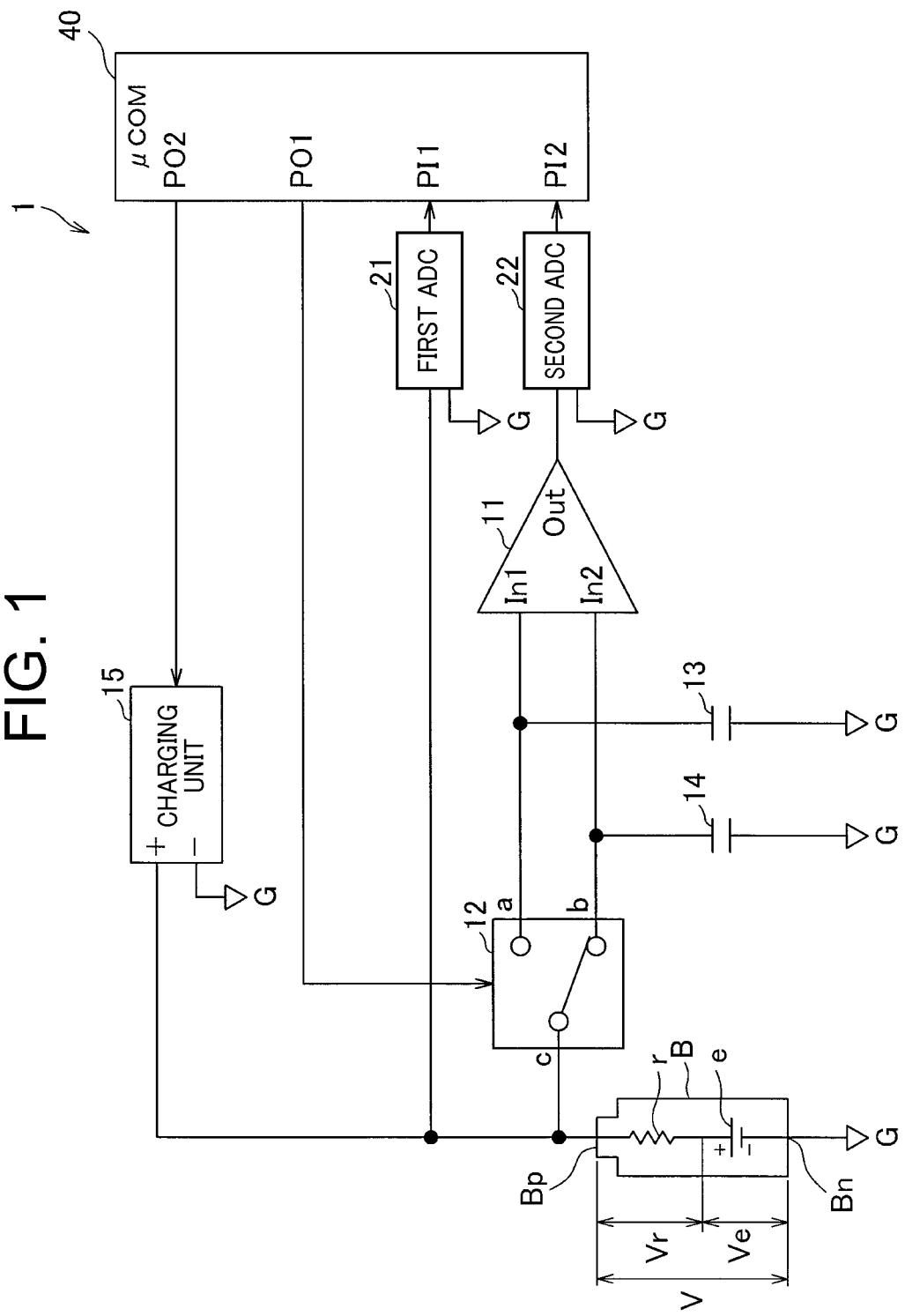
FIG. 1 is a diagram illustrating a schematic configuration of a battery state detection device according to a first embodiment of the present invention.

FIG. 1 is a diagram illustrating a schematic configuration of a battery state detection device according to the first embodiment of the present invention. FIG. 2 is a flow chart illustrating an example of battery state detection processing 1 executed by a CPU in a microcomputer included in the battery state detection device illustrated in FIG. 1.

The battery state detection device according to the present embodiment is mounted on, for example, an electric vehicle and connected between electrodes of a secondary battery included in the electric vehicle to detect internal resistance of the secondary battery as a state of the secondary battery. As a matter of course, the battery state detection device according to the present embodiment may be applied to a device or a system including a secondary battery other than the electric vehicle.

Such a secondary battery (denoted by a reference character B in FIG. 1) includes an electromotive force portion e generating voltage and an internal resistance r. In the secondary battery B, a voltage V is generated between the electrodes (a positive electrode Bp and a negative electrode Bn). This voltage V is determined by a voltage Ve generated by electromotive force, which is generated by the electromotive force portion e, and a voltage Vr generated by a flow of a current through the internal resistance r (V=Ve+Vr). The negative electrode Bn of the secondary battery B is connected to reference potential G.

As illustrated in FIG. 1, the battery state detection device (denoted by a reference character 1 in FIG. 1) according to the present embodiment includes an amplifier 11, a changeover switch 12, a first capacitor 13, a second capacitor 14, a charging unit 15, a first analog-digital converter 21, a second analog-digital converter 22, and a microcomputer 40 (hereafter referred to as "μCOM 40").

The amplifier 11 includes, for example, an operational amplifier. The amplifier 11 includes two input terminals (a first input terminal In1 and a second input terminal In2) and one output terminal (output terminal Out). An amplified voltage Vm obtained by amplifying a difference value between voltages input to these two input terminals with a predetermined amplification factor Av is output from the output terminal. The amplifier 11 is equivalent to a difference voltage output unit, and the amplified voltage Vm is equivalent to a difference voltage.

The changeover switch 12 is a switch of one circuit and two contacts (SPDT (single pole double throw)) formed of, for example, an analog switch. In the changeover switch 12, one changeover terminal "a" included in two changeover terminals "a" and "b" is connected to a first input terminal In1 of the amplifier 11 and the other changeover terminal "b" is connected to a second input terminal In2 of the amplifier 11. In the changeover switch 12, a common terminal "c" is connected to the positive electrode Bp of the secondary battery B (one terminal of the secondary battery). The changeover switch 12 is connected to the μCOM 40 described later. In response to a control signal from the μCOM 40, the changeover switch 12 changes over connection between the two changeover terminals "a" and "b" and the common terminal "c," and connects the positive pole Bp of the secondary battery B to the first input terminal In1 and the second input terminal In2 exclusively.

The first capacitor 13 is connected between the first input terminal In1 of the amplifier 11 and the reference potential G. In other words, the first capacitor 13 is provided between the first input terminal In1 and the negative electrode Bn of the secondary battery B. As a result, a voltage between the first input terminal In1 and the negative electrode Bn of the secondary battery B is retained in the first capacitor 13.

The second capacitor 14 is connected between the second input terminal In2 of the amplifier 11 and the reference potential G. In other words, the second capacitor 14 is provided between the second input terminal In2 and the negative electrode Bn of the secondary battery B. As a result, a voltage between the second input terminal In2 and the negative electrode Bn of the secondary battery B is retained in the second capacitor 14.

The charging unit 15 is connected between the positive electrode Bp of the secondary battery B and the reference potential G (i.e., the negative electrode Bn of the secondary battery B). The charging unit 15 is provided to be able to let a predetermined charging current Ic flow through the secondary battery B when charging the secondary battery B. The charging unit 15 is connected to the μCOM 40 described later. In response to a control signal from the μCOM 40, the charging unit 15 lets the charging current Ic flow through the secondary battery B to charge the secondary battery B and stops letting the charging current Ic flow through the secondary battery B to stop the charging. The charging unit 15 is equivalent to a charging unit.

The first analog-digital converter 21 (hereafter referred to as "first ADC 21") quantizes a voltage between the electrodes of the secondary battery B (i.e., a voltage between the positive electrode Bp and the negative electrode Bn of the secondary battery B), and outputs a signal indicating a digital value corresponding to the voltage. The second analog-digital converter 22 (hereafter referred to as "second ADC 22") quantizes the amplified voltage Vm output from the amplifier 11, and outputs a signal indicating a digital value corresponding to the amplified voltage Vm. In the present embodiment, the ADC 21 and the ADC 22 are mounted as discrete electronic components. However, this shall not apply. For example, each voltage may be quantized by using an analog-digital conversion unit incorporated in the μCOM 40 described later.

The μCOM 40 is configured to incorporate a CPU, a ROM, a RAM, and so on. The μCOM 40 takes charge of controlling the whole of the battery state detection device 1. A control program for causing the CPU to function as various unit such as a charging control unit, a connection changeover control unit, a battery state detection unit, and the like is stored in the ROM previously. The CPU functions as the various unit by executing the control program.

The μCOM 40 includes a first output port PO1 connected to the changeover switch 12 and a second output port PO2 connected to the charging unit 15. The CPU in the μCOM 40 transmits a control signal to the changeover switch 12 through the first output port PO1, and controls the changeover switch 12 to connect the positive electrode Bp of the secondary battery B to the first input terminal In1 under charging of the secondary battery B and connect the positive electrode Bp of the secondary battery B to the second input terminal In2 under suspension of charging of the secondary battery B. Furthermore, the CPU in the μCOM 40 transmits a control signal to the charging unit 15 through the second output port PO2, and controls the charging unit 15 to stop charging of the secondary battery B when the voltage V between the electrodes of the secondary battery B has become a predetermined state detection voltage Vth under charging of the secondary battery B conducted by the charging unit 15.

The μCOM 40 includes a first input port PI1 to which a signal output from the first ADC 21 is input, and a second input port PI2 to which a signal output from the second ADC 22 is input. The signals input to the first input port PI1 and the second input port PI2 are converted to information of a form that can be recognized by the CPU in the μCOM 40 and sent to the CPU. The CPU in the μCOM 40 detects the voltage V between the electrodes of the secondary battery B and the amplified voltage Vm based on the information. The CPU detects the internal resistance r of the secondary battery B based on the amplified voltage Vm and the charging current Ic.

The μCOM 40 includes a communication port, which is not illustrated. The communication port is connected to an in-vehicle network (such as, for example, CAN (Controller Area Network)), which is not illustrated. The communication port is connected to a display device such as a terminals device for vehicle maintenance through the in-vehicle network. The CPU in the μCOM 40 transmits a signal that indicates the detected internal resistance to the display device through the communication port and the in-vehicle network. The display device displays the state of the secondary battery B such as the internal resistance based on the signal. Or the CPU in the μCOM 40 may transmit a signal that indicates the detected internal resistance to a display device such as a combination meter mounted on a vehicle through the communication port and the in-vehicle network, and the display device may display the state of the secondary battery B such as the internal resistance based on the signal.

An example of the battery state detection processing 1 in the μCOM 40 included in the battery state detection device 1 described above will now be described with reference to the flow chart in FIG. 2.

For example, upon receiving a charging start instruction of the secondary battery B from an electronic control device mounted on a vehicle through the communication port, the CPU in the μCOM 40 (hereafter referred to simply as "CPU") transmits a control signal of charging start to the charging unit 15 through the second output port PO2. In response to the control signal, the charging unit 15 begins to let a predetermined constant charging current Ic through the secondary battery B. As a result, charging of the secondary battery B is started. And the processing proceeds to the battery state detection processing 1 illustrated in FIG. 2.

In the battery state detection processing 1, the charging current Ic flows through the secondary battery B and charging is conducted. The CPU transmits a control signal to the changeover switch 12 through the first output port PO1 to connect one changeover terminal "a" to the common terminal "c" (S110). In response to the control signal, the changeover switch 12 connects one changeover terminal "a" to the common terminal "c". Consequently, the positive electrode Bp of the secondary battery B is connected to the first input terminal In1 of the amplifier 11. As a result, the first capacitor 13 is connected between the positive electrode Bp and the negative electrode Bn of the secondary battery B. Charge flows into the first capacitor 13 from the secondary battery B and the charging unit 15. If time elapses to some degree, the first capacitor 13 store charge up to an upper limit of the capacity thereof. A voltage between the electrodes of the secondary battery B in charging is retained in the first capacitor.

Then, the CPU waits until the voltage between the electrodes of the secondary battery becomes the state detection voltage Vth. Specifically, the CPU detects the voltage between the electrodes of the secondary battery B periodically based on information obtained from the signal input to the first input port PI1 until the voltage between the electrodes of the secondary battery B becomes the predetermined state detection voltage Vth (S120). If the voltage between the electrodes of the secondary battery B becomes the predetermined state detection voltage Vth, the CPU transmits a control signal to the changeover switch 12 through the first output port PO1 to connect the other changeover terminal "b" to the common terminal "c" (S130). Nearly at the same time, the CPU transmits a control signal to the charging unit 15 through the second output port PO2 to stop the charging (S140). In response to the control signal from the CPU, the changeover switch 12 connects the other changeover terminal "b" to the common terminal "c". Consequently, the positive electrode Bp of the secondary battery B is connected to the second input terminal In2 of the amplifier 11. As a result, the second capacitor 14 is connected between the positive electrode Bp and the negative electrode Bn of the secondary battery B. Charge flows into the second capacitor 14 from the secondary battery B. The charging unit 15 stops the charging current Ic to the secondary battery B in response to the control signal from the CPU.

Elapse of a charge storage term preset for the second capacitor 14 to store charge up to an upper limit of the capacity thereof is waited (S150). When the charge storage term has elapsed, the second capacitor 14 stores charge up to the upper limit of the capacity thereof and a voltage retained by the second capacitor 14 becomes stable. The voltage between the electrodes of the secondary battery B under suspension of charging is retained in the second capacitor.

When the voltage retained by the second capacitor becomes stable (i.e., when the charge storage term has elapsed), the CPU detects the amplified voltage Vm output from the amplifier 11, based on information obtained from the signal input to the second input port PI2 (S160).

Then, the CPU detects the internal resistance r of the secondary battery B by dividing the detected amplified voltage Vm by the amplification factor Av of the amplifier 11 and further dividing a result by the charging current Ic (r=(Vm/Av)/Ic) (S170). The CPU transmits the detected internal resistance r of the secondary battery B to other devices through the communication port.

Finally, the CPU transmits a control signal to the charging unit 15 through the second output port PO2 to start charging (S180). In response to the control signal, the charging unit 15 begins to let the predetermined constant charging current Ic flow through the secondary battery B again. As a result, charging is resumed and the battery state detection processing 1 is finished.

Figure 2:
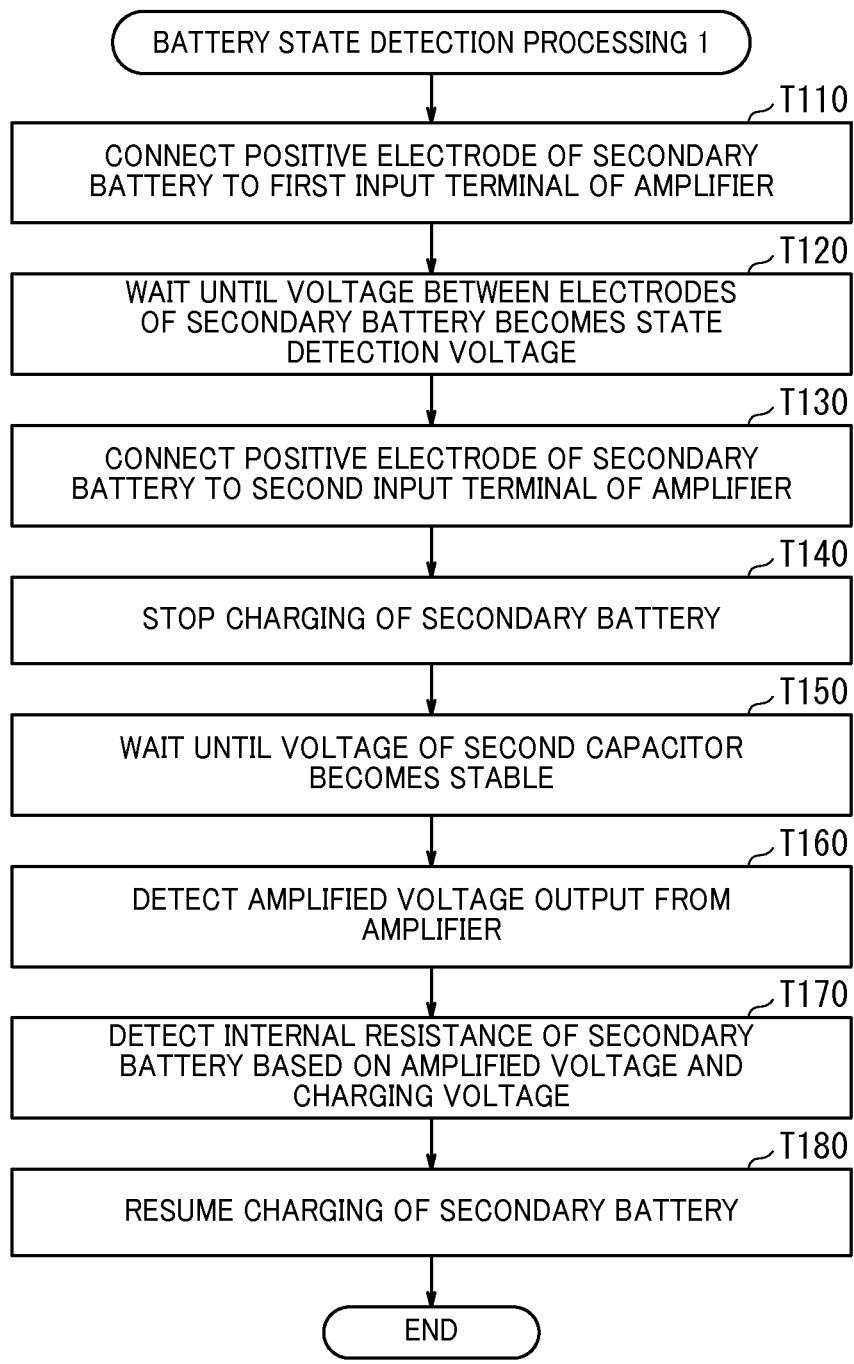
FIG. 2 is a flow chart illustrating an example of battery state detection processing 1 executed by a CPU in a microcomputer included in the battery state detection device illustrated in FIG. 1.

The CPU that executes the processing in step S140 in the flow chart in FIG. 2 is equivalent to a charging control unit. The CPU that executes the processing in step S110 and step S130 is equivalent to a connection changeover control unit. The CPU that executes the processing in step S170 is equivalent to a battery state detection unit.

As described heretofore, according to the present embodiment, the amplifier 11 has the first input terminal In1 and the second input terminal In2, and outputs the amplified voltage Vm depending upon a difference value between voltages input to the first input terminal In1 and the second input terminal In2 respectively. The changeover switch 12 connects the positive electrode Bp of the secondary battery B to the first input terminal In1 and the second input terminal In2 exclusively. The first capacitor 13 is provided between the first input terminal In1 and the negative electrode Bn of the secondary battery B to retain the voltage between the first input terminal In1 and the negative electrode Bn of the secondary battery B. The second capacitor 14 is provided between the second input terminal In2 and the negative electrode Bn of the secondary battery B to retain the voltage between the second input terminal In2 and the negative electrode Bn of the secondary battery B. The charging unit 15 lets the predetermined charging current Ic flow through the secondary battery B and charges the secondary battery B. The CPU in the μCOM 40 functions as the charging control unit, the connection changeover control unit, and the battery state detection unit. The charging control unit controls the charging unit 15 to stop charging of the secondary battery B when the voltage V between the electrodes of the secondary battery B has become the predetermined state detection voltage Vth under charging of the secondary battery B conducted by the charging unit 15. The connection changeover control unit controls the changeover switch 12 to connect the positive electrode Bp of the secondary battery B to the first input terminal In1 under charging of the secondary battery B and connect the Bp of the secondary battery B to the second input terminal In2 under suspension of charging of the secondary battery B. When the voltage retained by the second capacitor 14 has become stable after the changeover switch 12 is controlled by the connection changeover control unit to change over connection of the positive electrode Bp of the secondary B from the first input terminal In1 to the second input terminal In2, the battery state detection unit detects the internal resistance r of the secondary battery B based on the amplified voltage Vm output from the amplifier 11 and the charging current Ic.

Under charging, therefore, the positive electrode Bp of the secondary battery B is connected to the first input terminal In1 of the amplifier 11 by the changeover switch 12. As a result, charge flows into the first capacitor 13 from the secondary battery B and the charging unit 15. Since charging of the secondary battery B is conducted for a comparatively long time, the first capacitor 13 stores charge up to the upper limit of the capacity thereof. The same voltage as the voltage between the electrodes of the secondary battery B under charging is retained in the first capacitor 13. Under suspension of charging, the positive electrode Bp of the secondary battery B is connected to the second input terminal In2 of the amplifier 11 by the changeover switch 12. As a result, charge flows into the second capacitor 14 from the secondary battery B. If the second capacitor 14 stores charge up to the upper limit of the capacity thereof, the voltage retained by the second capacitor 14 becomes stable. At this time, the same voltage as the voltage between the electrodes of the secondary battery B under suspension of charging is retained in the second capacitor 14. A voltage Vc between the electrodes of the secondary battery B under charging becomes the sum of a voltage Vec generated by electromotive force of the secondary battery B and the voltage Vr generated by a flow of the charging current Ic through the internal resistance r of the secondary battery B (Vc=Vec+Vr). A voltage Vd between the electrodes of the secondary battery B under suspension of charging becomes the same value as a voltage Ved generated by the electromotive force of the secondary battery B (Vd=Ved). When the voltage of the second capacitor 14 becomes stable, a portion of charge charged into the secondary battery B has flown through the second capacitor. However, a quantity thereof is negligibly small as compared with the capacity of the secondary battery B. Therefore, the voltage Vec generated by the electromotive force of the secondary battery B contained in the voltage retained by the first capacitor 13 at this time (i.e., the voltage Vc between the electrodes of the secondary battery B under charging) and the voltage Ved generated by the electromotive force of the secondary battery B contained in the voltage retained by the second capacitor 14 (i.e., the voltage Vd between the electrodes of the secondary battery under suspension of charging) can be regarded as the same value (Vec=Ved). Therefore, a difference value ΔV between the voltage Vc between the electrodes of the secondary battery B under charging and the voltage Vd between the electrodes of the secondary battery under suspension of charging becomes the voltage Vr generated by the flow of the charging current Ic through the internal resistance r (ΔV=Vc−Vd=Vr). Therefore, a voltage measured by using a voltmeter is not used. The voltage Vc between the electrodes of the secondary battery B under charging and the voltage Vd between the electrodes of the secondary battery B under suspension of charging are retained respectively. The amplified voltage Vm obtained by amplifying the difference value ΔV between the voltages becomes a value depending upon the internal resistance r of the secondary battery B. Therefore, it is possible to suppress falling in the detection precision of the internal resistance r of the secondary battery B by detecting the internal resistance r of the secondary battery B by use of the amplified voltage Vm.

Furthermore, the amplifier 11 amplifies the difference value between the voltage input to the first input terminal In1 and the voltage input to the second input terminal In2 with a predetermined amplification factor and outputs a resultant voltage. By doing so, it is possible to obtain the difference value as a further large value. It is possible to further suppress the falling in the detection precision of the state of the secondary battery.

Second Embodiment

Hereafter, a battery state detection device according to a second embodiment of the present invention will be described with reference to FIG. 3 and FIG. 4.

Figure 3:
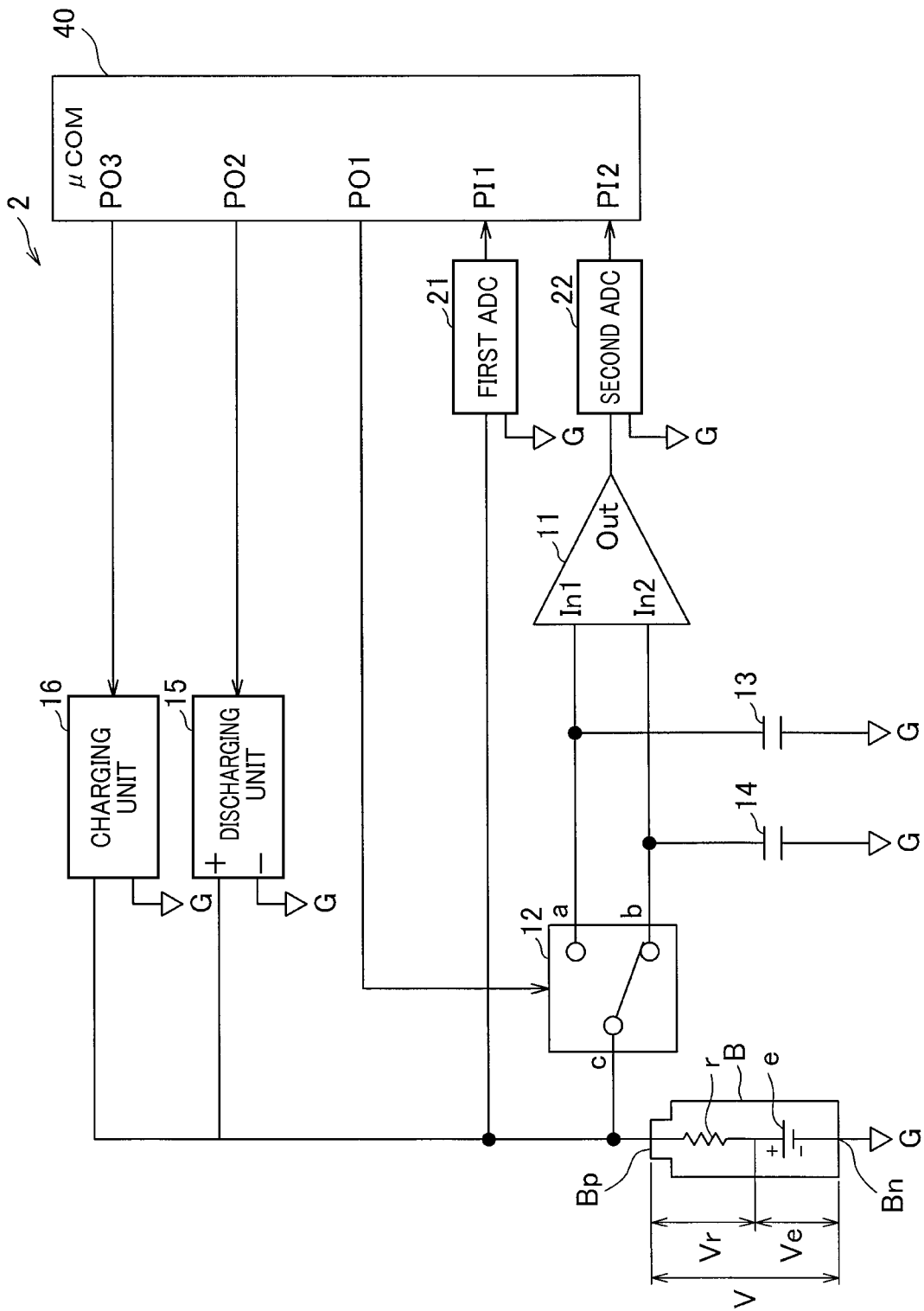
FIG. 3 is a diagram illustrating a schematic configuration of a battery state detection device according to a second embodiment of the present invention.

FIG. 3 is a diagram illustrating a schematic configuration of a battery state detection device according to a second embodiment of the present invention. FIG. 4 is a flow chart illustrating an example of battery state detection processing 2 executed by a CPU in a microcomputer included in the battery state detection device illustrated in FIG. 3.

The battery state detection device according to the present embodiment is also mounted on, for example, an electric vehicle and connected between electrodes of a secondary battery included in the electric vehicle to detect internal resistance of the secondary battery as a state of the secondary battery, in the same way as the first embodiment described above. As a matter of course, the battery state detection device according to the present embodiment may be applied to a device or a system including a secondary battery other than the electric vehicle.

As illustrated in FIG. 3, the battery state detection device (denoted by a reference character 2 in FIG. 3) includes an amplifier 11, a changeover switch 12, a first capacitor 13, a second capacitor 14, a charging unit 15, a discharging unit 16, a first analog-digital converter 21 (first ADC 21), a second analog-digital converter 22 (second ADC 22), and a microcomputer 40 (µCOM 40).

The battery state detection device 2 according to the present embodiment has the same configuration as that of the battery state detection device 1 according to the first embodiment described above, except that the discharging unit 16 is further included and the CPU in the µCOM 40 is caused to further function as a discharging control unit. The same component is denoted by a like reference character, and description thereof will be omitted.

The discharging unit 16 is connected between the positive electrode Bp of the secondary battery B and the reference potential G (i.e., the negative electrode Bn of the secondary battery B). The discharging unit 16 is provided to be able to let a predetermined discharging current id having the same current value as the charging current Ic flow from the secondary battery B at the time of discharging of the secondary battery B. The discharging unit 16 is connected to the µCOM 40. In response to a control signal from the µCOM 40, the discharging unit 16 lets the discharging current id flow from the secondary battery B to conduct discharging, and stops letting the discharging current id flow from the secondary battery B to stop discharging. The discharging unit 16 is equivalent to a discharging unit.

The µCOM 40 has a third output port PO3 connected to the discharging unit 16 in addition to the first output port PO1 and the second output port PO2. The CPU in the µCOM 40 transmits a control signal to the discharging unit 16 through the third output port PO3, and controls the discharging unit 16 to discharge the secondary battery B when charging of the secondary battery B conducted by the charging unit 15 is stopped.

An example of the battery state detection processing 2 in the µCOM 40 included in the battery state detection device 2 described above will now be described with reference to the flow chart in FIG. 4.

For example, upon receiving a charging start instruction of the secondary battery B from an electronic control device mounted on a vehicle through the communication port, the CPU in the µCOM 40 (hereafter referred to simply as "CPU") transmits a control signal of charging start to the charging unit 15 through the second output port PO2. In response to the control signal, the charging unit 15 begins to let a predetermined constant charging current Ic flow through the secondary battery B. As a result, charging of the secondary battery B is started. Then, the processing proceeds to the battery state detection processing 2 illustrated in FIG. 4.

In the battery state detection processing 2, the charging current Ic flows through the secondary battery B and charging is conducted. The CPU transmits a control signal to the changeover switch 12 through the first output port PO1 to connect one changeover terminal "a" to the common terminal "c" (T110). In response to the control signal, the changeover switch 12 connects one changeover terminal "a" to the common terminal "c". Consequently, the positive electrode Bp of the secondary battery B is connected to the first input terminal In1 of the amplifier 11. As a result, the first capacitor 13 is connected between the positive electrode Bp and the negative electrode Bn of the secondary battery B. Charge flows into the first capacitor 13 from the secondary battery B and the charging unit 15. If time elapses to some degree, the first capacitor 13 store charge up to an upper limit of the capacity thereof. A voltage between the electrodes of the secondary battery B under charging is retained in the first capacitor.

Then, the CPU waits until the voltage between the electrodes of the secondary battery becomes the state detection voltage Vth. Specifically, the CPU detects the voltage between the electrodes of the secondary battery B periodically based on information obtained from the signal input to the first input port PI1 until the voltage between the electrodes of the secondary battery B becomes the predetermined state detection voltage Vth (T120). If the voltage between the electrodes of the secondary battery B becomes the predetermined state detection voltage Vth, the CPU transmits a control signal to the changeover switch 12 through the first output port PO1 to connect the other changeover terminal "b" to the common terminal "c" (T130). Nearly at the same time, the CPU transmits a control signal to the charging unit 15 through the second output port PO2 to stop the charging (T140). In response to the control signal from the CPU, the changeover switch 12 connects the other changeover terminal "b" to the common terminal "c". Consequently, the positive electrode Bp of the secondary battery B is connected to the second input terminal In2 of the amplifier 11. As a result, the second capacitor 14 is connected between the positive electrode Bp and the negative electrode Bn of the secondary battery B. Charge flows into the second capacitor 14 from the secondary battery B. The charging unit 15 stops the charging current Ic to the secondary battery B in response to the control signal from the CPU.

Then, the CPU transmits a control signal to the discharging unit 16 through the third output port PO3 to start discharging. In response to the control signal, the discharging unit 16 begins to let the predetermined constant discharging current Id (having the same value as that of the charging current Ic) from the secondary battery B. As a result, discharging of the secondary battery B is started (T145).

Elapse of a predetermined charge storage term for the second capacitor 14 to store charge up to an upper limit of the capacity thereof is waited (T150). When the charge storage term has elapsed, the second capacitor 14 stores charge up to the upper limit of the capacity thereof and a voltage retained by the second capacitor 14 becomes stable. The voltage between the electrodes of the secondary battery B under suspension of charging (i.e., under discharging) is retained in the second capacitor.

When the voltage retained by the second capacitor becomes stable (i.e., when the charge storage term has elapsed), the CPU detects the amplified voltage Vm output from the amplifier 11, based on information obtained from the signal input to the second input port PI2 (T160).

Then, the CPU detects the internal resistance r of the secondary battery B by dividing a half value of the detected amplified voltage Vm by the amplification factor Av of the amplifier 11 and further dividing a result by the charging current Ic (r=(Vm/Av)/(Ic×2)) (T170). The CPU transmits the detected internal resistance r of the secondary battery B to other devices through the communication port.

Then, the CPU transmits a control signal to the discharging unit 16 through the third output port PO3 to stop the discharging. In response to the control signal, the discharging unit 16 stops the discharging current Id from the secondary battery B (T175).

Finally, the CPU transmits a control signal to the charging unit 15 through the second output port PO2 to start charging (T180). In response to the control signal, the charging unit 15 begins to let the predetermined constant charging current Ic flow through the secondary battery B again. As a result, charging is resumed and the battery state detection processing 2 is finished.

Figure 4:
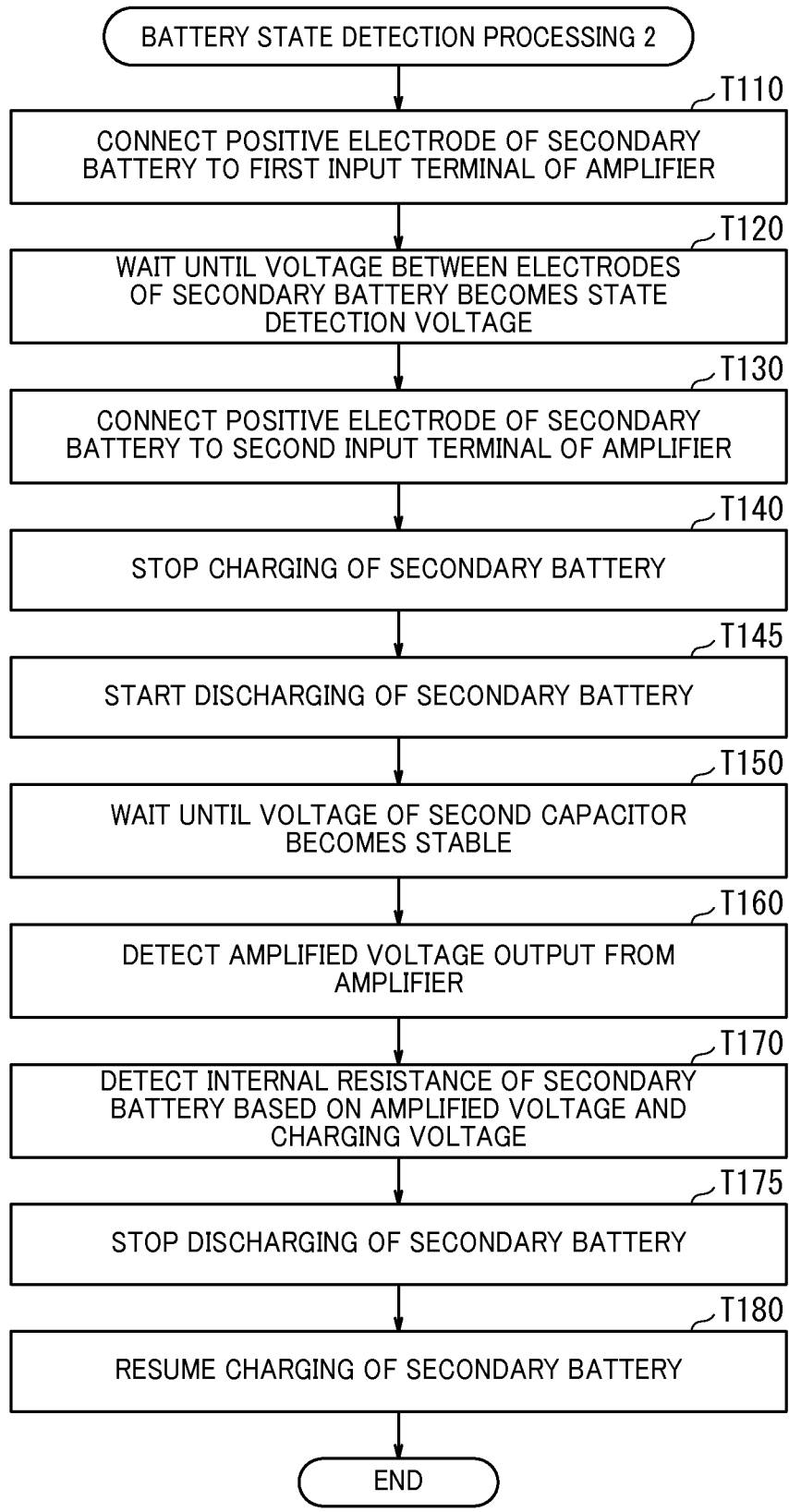
FIG. 4 is a flow chart illustrating an example of battery state detection processing 2 executed by a CPU in a microcomputer included in the battery state detection device illustrated in FIG. 3.
Figure 5:
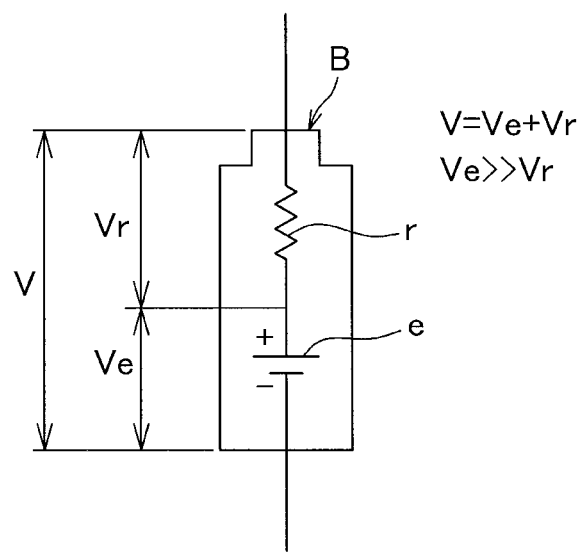
FIG. 5 is a diagram illustrating an equivalent circuit of a secondary battery.

The CPU that executes the processing in step T140 in the flow chart in FIG. 4 is equivalent to a charging control unit.

The CPU that executes the processing in step T145 is equivalent to a discharging control unit. The CPU that executes the processing in step T110 and step T130 is equivalent to a connection changeover control unit. The CPU that executes the processing in step T170 is equivalent to a battery state detection unit.

As described heretofore, according to the present embodiment, the discharging unit 16 is further provided to let the discharging current Id having the same value as that of the predetermined charging current Ic flow from the secondary battery B to conduct discharging, in addition to the above-described configuration of the first embodiment. Furthermore, the CPU in the μCOM 40 further functions as the discharging control unit. When the charging control unit has stopped charging of the secondary battery B conducted by the charging unit 15, the discharging control unit controls the discharging unit 16 to discharge the secondary battery B. As a result, the secondary battery B is discharged by the discharging unit 16 under suspension of charging. A voltage Vd between the electrodes of the secondary battery B at this time becomes a difference between a voltage Ved generated by electromotive force of the secondary battery B and a voltage Vr generated by a flow of the discharging current Id having the same value as that of the charging current Ic through the internal resistance r of the secondary battery B (Vd=Ved−Vr). When the voltage retained by the second capacitor 14 has become stable, the voltage Vec generated by the electromotive force of the secondary battery B contained in the voltage retained by the first capacitor 13 (i.e., the voltage Vc between the electrodes of the secondary battery under charging) and the voltage Ved generated by the electromotive force of the secondary battery B contained in the voltage retained by the second capacitor 14 (i.e., the voltage Vd between the electrodes of the secondary battery under suspension of charging) can be regarded as the same value (Vec=Ved). Therefore, a difference value ΔV between the voltage Vc between the electrodes of the secondary battery B under charging and the voltage Vd between the electrodes of the secondary battery B under discharging becomes a value twice the voltage Vr generated by the flow of the charging current Ic through the internal resistance r (ΔV=Vc−Vd=Vr×2). Therefore, a voltage measured by using a voltmeter is not used. The voltage Vc between the electrodes of the secondary battery B under charging and the voltage Vd between the electrodes of the secondary battery B under suspension of charging are retained respectively. The amplified voltage Vm obtained by amplifying the difference value ΔV between the voltages becomes a value depending upon the internal resistance r of the secondary battery B. Therefore, it is possible to suppress falling in the detection precision of the internal resistance r of the secondary battery by detecting the internal resistance of the secondary battery B by use of the amplified voltage Vm. Furthermore, the amplified voltage Vm becomes twice in value as compared with the configuration in which discharging is not conducted under suspension of charging. As a result, the falling in the detection precision of the state of the secondary battery can be further suppressed.

Furthermore, the amplifier 11 amplifies a difference value between the voltage input to the first input terminal In1 and the voltage input to the second input terminal In2 with a predetermined amplification factor, and outputs a resultant voltage. As a result, the difference value can be obtained as a larger value, and falling in the detection precision of the state of the secondary battery can be further suppressed. The discharging current Id generated by the discharging unit 16 is set to be the same in value as the charging current Ic. However, the discharging current Id may not be the same in value as the charging current Ic. For example, if the discharging current Id is n times in value the charging current Ic, the difference value ΔV between the voltage Vc between the electrodes of the secondary battery B under charging and the voltage Vd between the electrodes of the secondary battery B under discharging becomes (1+n) times in value the voltage Vr generated by a flow of the charging current Ic through the internal resistance r. Therefore, the CPU can detect the internal resistance r of the secondary battery B by dividing a value of 1/(1+n) of the detected amplified voltage Vm by the amplification factor Av of the amplifier 11 and further dividing a resultant value by the charging current Ic (T170).

Heretofore, the present invention has been described with reference to preferable embodiments. However, the battery state detection device according to the present invention is not restricted to the configurations of these embodiments.

For example, each of the above-described embodiments has a configuration in which the first ADC 21 detects the voltage between the electrodes of the secondary battery B and the CPU in the μCOM 40 compares the voltage with the state detection voltage. However, each of the above-described embodiments is not restricted to the configuration. For example, a configuration in which the voltage at the positive electrode Bp of the secondary battery B is compared with the state detection voltage by using an electronic component such as a comparator may be used. By doing so, the state detection voltage can be detects with a simple configuration without using a high precision ADC.

Each of the above-described embodiments has a configuration in which the internal resistance r of the secondary battery B is detected as the state of the secondary battery. However, each of the above-described embodiments is not restricted to the configuration. It is also possible to use a configuration in which the SOH is further detected from the internal resistance r by utilizing that there is correlation between the internal resistance r of the secondary battery B and the SOH of the secondary battery B.

Each of the above-described embodiments has a configuration in which the battery state detection device detects the internal resistance r of one secondary battery B. However, each of the above-described embodiments is not restricted to the configuration. For example, a configuration in which a multiplexer is provided ahead of the battery state detection device and the battery state detection device is connected to a plurality of secondary batteries B by changing over the multiplexer may be used.

The above-described embodiments only indicate representative embodiments of the present invention. The present invention is not restricted to the embodiments. In other words, those skilled in the art can modify and execute the embodiments without departing from the spirit of the invention in accordance with conventional known knowledge. As long as the configuration of the battery state detection device according to the present invention is still included after such modifications, it is a matter of course that resultant configurations are incorporated in the scope of the present invention.

REFERENCE SIGNS LIST 1, 2 Battery state detection device
11 Amplifier (difference voltage output unit)
12 Changeover switch
13 First capacitor
14 Second capacitor
15 Charging unit (charging unit)
16 Discharging unit (discharging unit)
40 Microcomputer (charging control unit, connection changeover control unit, battery state detection unit)
B Secondary battery
Bp Positive electrode of secondary battery
Bn Negative electrode of secondary battery
Vm Amplified voltage (difference voltage)
e Electromotive force unit
r Internal resistance

The invention claimed is:

1. A battery state detection device that detects a state of a secondary battery, comprising:
a difference voltage output unit having a first input terminal and a second input terminal, the difference voltage output unit being configured to output a difference voltage depending upon a difference value between voltages respectively input to the first input terminal and the second input terminal;
a single-pole double-throw changeover switch having a common terminal always connected to a first electrode of the secondary battery and configured to be switched and connected between the first input terminal or the second input terminal exclusively;
a first capacitor provided between the first input terminal and a second electrode of the secondary battery;
a second capacitor provided between the second input terminal and the second electrode of the secondary battery;
a charging unit configured to let a predetermined charging current flow through the secondary battery to charge the secondary battery;
a charging control unit configured to control the charging unit to stop charging of the secondary battery when a voltage between the first electrode and the second electrode of the secondary battery has become a predetermined state detection voltage during charging of the secondary battery conducted by the charging unit;
a discharging unit configured to let flow a discharging current from the secondary battery to discharge the secondary battery, a magnitude of the discharging current being equal to that of the predetermined charging current;
a discharging control unit configured to control the discharging unit to discharge the secondary battery when the charging of the secondary battery conducted by the charging unit is stopped by the charging control unit;
a connection changeover control unit configured to control the changeover switch to connect the first electrode of the secondary battery to the first input terminal under charging of the secondary battery and connect the first electrode of the secondary battery to the second input terminal under discharging of the secondary battery by the discharging unit; and
a battery state detection unit configured to detect a state of the secondary battery based on the difference voltage output from the difference voltage output unit and the charging current by calculating an internal resistance r in accordance with an equation of $r=Vm/(2 \times Av \times Ic)$, where Vm, Av, and Ic correspond to the differential voltage, an amplification factor of the difference voltage output unit, and the charging current, respectively, when a voltage retained by the second capacitor has become stable after the changeover switch is controlled by the connection changeover control unit to change over connection of the first electrode of the secondary battery from the first input terminal to the second input terminal.

2. The battery state detection device according to claim 1, wherein the difference voltage output unit is configured to output a voltage obtained by amplifying the difference value with a predetermined amplification factor, as the difference voltage.

* * * * *